SOLID STATE SCANNING SYSTEM

Filed Sept. 29, 1966

Inventor
CARL P. SANDBANK
By Percy P. Lantzy
Attorney

March 18, 1969 C. P. SANDBANK 3,434,008

SOLID STATE SCANNING SYSTEM

Filed Sept. 29, 1966

Sheet 2 of 3

Inventor
CARL P. SANDBANK
By [signature]
Attorney

Inventor
CARL P. SANDBANK
By Percy P. Lantzy
Attorney

United States Patent Office 3,434,008
Patented Mar. 18, 1969

3,434,008

SOLID STATE SCANNING SYSTEM

Carl Peter Sandbank, Bishop's Stortford, England, assignor to International Standard Electric Corporation, New York, N.Y., a corporation of Delaware Filed Sept. 29, 1966, Ser. No. 583,003
Claims priority, application Great Britain, Oct. 27, 1965, 45,460/65
U.S. Cl. 315—169 10 Claims
Int. Cl. H05b 39/09

ABSTRACT OF THE DISCLOSURE

A solid state scanning system utilizes a pair of semiconductor devices exhibiting moving high field instability effects. The semiconductor bodies are arranged in transverse directions on a planar scanning element to form superimposed coordinate axes. Pulses propagated along each body providing coordinate scanning and cause an electro-luminescent layer to emit light at the points of intersection. The pulses may be coupled to a plurality of thin metal electrodes positioned transversely on each side of the layer.

This invention relates to solid state scanning systems utilizing semiconductor devices which include semiconductive material exhibiting moving high field instability effects.

If a crystal of certain semiconductive materials is subjected to a steady electrical field exceeding a critical value the resultant current flowing through the crystal contains an oscillatory component of frequency determined by the transit of a space charge distribution between the crystal contact areas. There are several examples of this phenomenon, three of these are given below:

(a) It was first reported by J. B. Gunn for III–V semiconductors, (Solid State Communications, volume 1, page 88, 1963) and for these materials the phenomenon is due to electron transfer from a high to a low mobility state; and, (b) In CdS the phenomenon is due to the inter-action between drifting electrons and acoustic phonons; and (c) It has also been shown that due to field dependent mobilities associated with trapping effects, very slow moving domains can be obtained in germanium under suitable conditions.

The frequency of oscillation is determined primarily by the length of the current path through the crystal. The phenomenon has been detected, as previously stated, in III–V semiconductors such as gallium arsenide and indium phosphide having n-type conductivity and also piezo-electric semiconductors.

In piezo-electric semiconductors the domain phenomenon, as previously stated, is due to the inter-actions between electrons and acoustic phonons. A phonon is defined as a quantum of lattice vibrational energy in a crystal lattice.

The term "semiconductive material exhibiting high field instability effects" is used herein to include at least any material exhibiting the effect as defined in the preceding paragraph, or exhibiting similar functional phenomena which may be based on somewhat different internal mechanisms.

The value of the applied field below which spontaneous self-oscillation does not occur will be termed the threshold value. If the value of the steady electrical field at some point within the body is caused by the actions of an input signal to exceed the threshold value for a time shorter than the instability transit time between the two contact areas between which the field is applied, the current passed through the body by the external source of potential difference will undergo a single excursion from its steady state value to provide an output pulse giving power gain.

In order to obtain the form of single pulse operation defined in the preceding paragraph the steady state value of the applied field must exceed a lower threshold value, determined by experiment for a given material and typically between 50% and 75% of the threshold value. The steady state field may be continuously applied or may be pulsed to reduce the total power dissipation in the device.

It will be seen that an arrangement according to the invention can be used to provide a solid-state scanning system capable of being triggered by an input pulse train to convert a unidirectional current source into a corresponding train of output pulses. The conditions for detection or display depend upon a voltage (or high electric field) appearing across one small area of the panel, or across one element of a mosaic and the modulation may be sensed or effected by an electrode applied simultaneously to the whole area of the plate or all elements of the mosaic. The system provides the means of achieving a region of localized high electric field which scans a solid-state photo-detection or display plate.

According to a feature of the invention a solid-state scanning system which includes two semiconductive circuit arrangements, each one of which includes a body of semiconductive material exhibiting high field instability effects and means for applying between spaced contact areas on said body a potential difference producing therein an electric field, wherein said semiconductive circuit arrangements are arranged such that the high field domains which are formed in said bodies of semiconductive material when said electric fields are in excess of the instability threshold values for said bodies are caused to propagate in different directions along said bodies to form coordinate axes thereby providing the means for achieving a localized region of high electric field with a co-ordinate scanning action.

The body of semiconductive material preferably consists of n-type gallium arsenide or indium phosphide; other III–V type semiconductors and piezo-electric semiconductors may also be employed.

The foregoing and other features according to the invention will be understood from the following description with reference to the accompanying drawings in which.

Figure 5A:
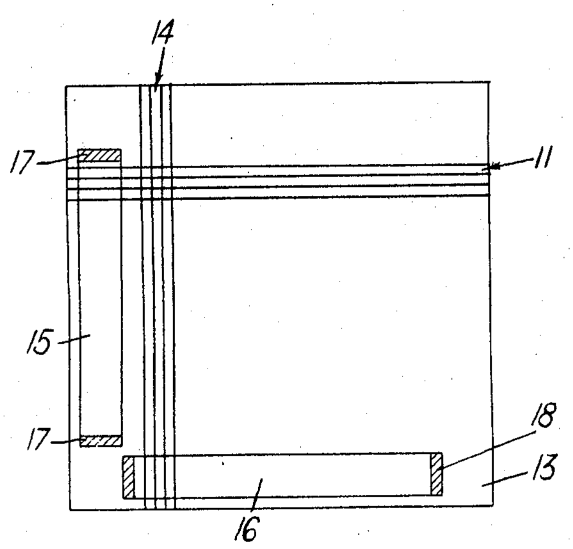
Figure 5B:
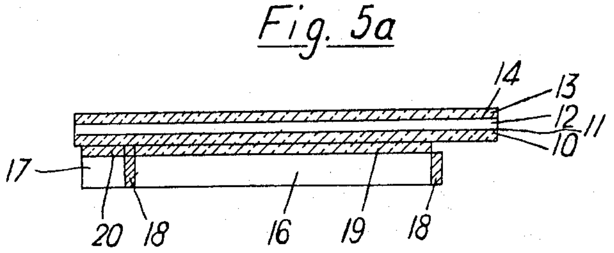
Figure 6A:
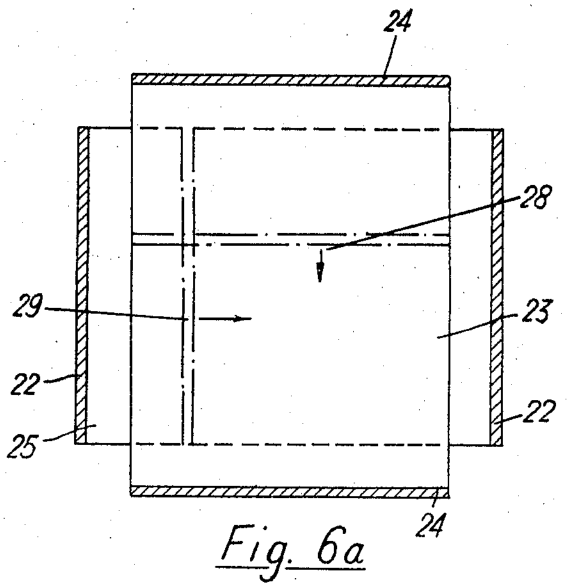
Figure 6B:
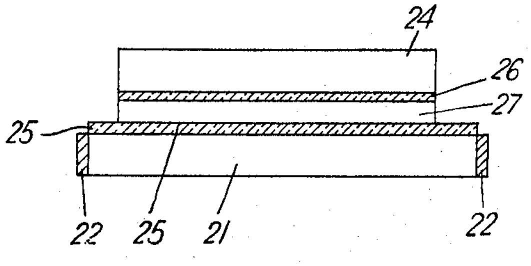

FIGS. 5*a* and *b* show a plan and front elevation views for a solid-state scanning system according to the invention;

FIGS. 6*a* and *b* show a plan and front elevation views for an alternative form of solid-state scanning system according to the invention.

Figure 1:
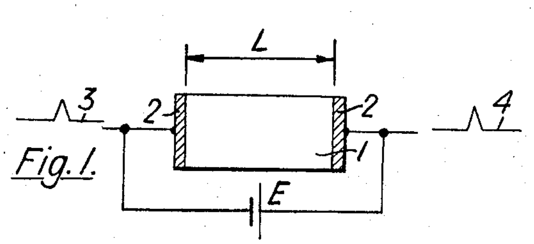
FIG. 1 shows diagrammatically a pulse generator in which the domain voltages are sensed at the anode.

Referring to FIG. 1, the active semiconductor element, for example, of n-type gallium arsenide or piezo-electric semiconductor, consists of a parallel-sided disc 1 having ohmic contact areas 2 secured to its plane faces. A unidirectional current source E, is used to apply a potential difference of controllable value between the contact areas 2, and the output circuit would be arranged to extract any oscillatory component of the current flowing in the crystal.

The phenomenon referred to in preceding paragraphs manifests itself by the appearance in the output circuit (not shown in the drawing) of an oscillatory component in the current through the crystal 1 when the potential difference applied across the crystal from the unidirectional current source exceeds a critical value; for a crystal of gallium arsenide of length $2\times10^{-2}$ cm. the critical potential necessary to cause oscillation is of the order of 40 volts, corresponding to a field within the crystal of the order of 2,000 volts per centimeter, the self-oscillatory frequency being directly related to the length L of the crystal and being of the order of $10^9$ cycles per second.

The potential difference applied between the contact areas 2 is a fraction determined by experiment of the potential necessary to cause self-oscillation and is chosen so that an oscillatory waveform or trigger pulse superimposed on it by an external source carries the crystal 1 into its self-oscillatory condition for short intervals of time during each cycle of the input frequency; in other words the peak value of the oscillatory signal voltage is caused to be just sufficient to raise the electric field within the crystal above the threshold value. In these conditions it is found that each triggering of the crystal 1 by the peak of a trigger pulse 3 for example, causes a sharp current pulse 4, drawing power from the potential source, to appear in the output circuit. Thus an oscillatory waveform applied to the device will cause a corresponding train of sharp current pulses to appear at the output. The operation of the device is virtually independent of frequency provided that the self-oscillatory frequency is at no time exceeded. The power output available from the device depends on the dissipation permissible within the crystal 1. The output power may amount to several watts, but since the efficiency is relatively low this will involve a relatively high dissipation within the crystal. The driving potential may be pulsed to reduce the standing dissipation.

Figure 2:
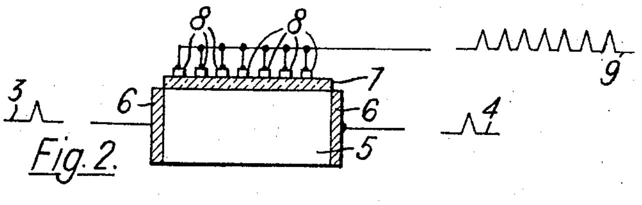
FIGS. 2 to 4 show diagrammatically alternative pulse generator arrangements in which the domain voltage is sensed by one or more electrodes along the device.
Figure 3:
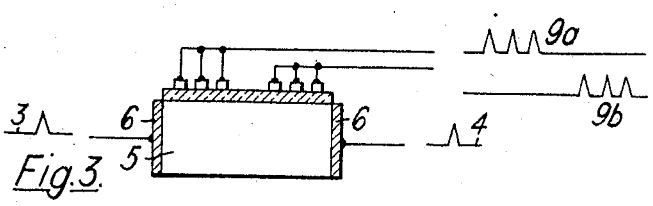
Figure 4:
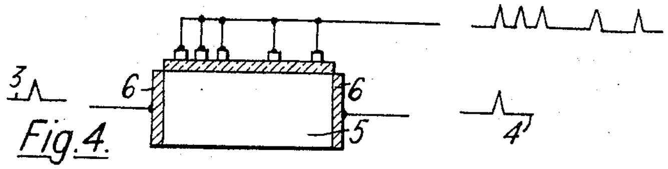

FIGS. 2 to 4 of the drawings show diagrammatically alternative pulse generator arrangements in which the semiconductor device is modified to provide means to produce complex wave forms and phase differences at frequencies of the order of $10^9$ cycles per second. In these arrangements the semiconductor crystal 5 has contact areas 6 on its end faces across which the potential difference and the oscillatory input or the trigger pulse 3 is applied in the same way as in the arrangement shown in the drawing according to FIG. 1. However, the output circuit from the device is changed in these arrangements, a further series of contact areas 8 are deposited on one of the side faces of the semiconductor crystal 5 and electrically insulated from it by a thin layer of insulating material 7 such as silica. The multiple electrodes are thus situated near the high field instability region in the device and as the high field, which manifests itself in the form of sharp current pulses in the output circuit, propagates along the device, due to the application of the trigger pulse 3 of each half-cycle of a sinusoidal input signal which is superimposed on the applied field so as to cause the threshold value to exceed the critical value of the device, it is sensed by each of the contact areas 8 in turn and capacitively coupled to the output by way of the layer 7 to produce a series of output pulses 9 shown in the drawing according to FIG. 2. By suitable arrangement of the contact areas 8 the output from the device could be coupled or sent into separate circuits with suitable delay as shown by the waveforms 9*a* and 9*b* in the drawing according to FIG. 3, or a variety of codes could be built into the pulse as shown in the drawing according to FIG. 4.

A solid-state scanning system using travelling high electric field devices as described in the preceding paragraphs is shown in the drawing according to FIGS. 5*a* and *b*.

Referring to FIGS. 5*a* and *b*, a glass plate 10 on which an evaporated raster of thin metal electrodes 11 representing the X or horizontal scan is covered completely with a layer 12 of electro-luminescent material and, another glass plate 13 containing a further series of electrodes 14 representing the Y or vertical scan which should be transparent to the luminescent radiation. Thus, if a potential difference exists between any two particular X and Y electrodes a glow would appear at the point of intersection.

The extremities of the two rasters are taken to the edges of the glass plates 10 and 13, and placed directly below them is a long single crystal element 15, for example of gallium arsenide, lying along the X direction and a similar element 16, for example of cadmium sulphide (CdS) lying along the Y direction. Ohmic contact areas 17 and 18 are respectively secured to the plane faces of the crystals 15 and 16 as previously described, between which is applied a unidirectional current source to apply a potential difference of controllable value. Thin layers 19 and 20 of insulating material such as silica are respectively formed on one face of the crystals 16 and 15.

It has been shown that when a high field is applied to, for example, gallium arsenide, the field in the crystal separates into a low field region which occupies most of the length of the crystal, and a region of high field (that is, one where a substantial fraction of the externally applied potential appears across a very short part of the total length of the crystal). This sharp voltage step travels through a crystal at a well-defined velocity of approximately $10^7$ cm./sec.

Thus, in the system shown in the drawing according to FIGS. 5*a* and *b* the passage of the voltage step will be characterized by a memory pulse of high potential appearing across successive electrodes 14 of the Y raster as the high field domain becomes capacitively coupled by way of the layer 19 to each one in turn. If the crystals are biased above the self-oscillating frequency then another domain would be launched as soon as the previous one has entered the right-hand electrode. Alternatively, as previously stated, the device can be operated in a triggered mode where there may be a gap of any desired duration between the launching of the domain.

It was stated in a previous paragraph that a similar effect has been observed in CdS, believed to be due to the inter-action between drifting electrons and acoustic phonons. The significance of this in this system is that the domains in CdS travel at a velocity closely associated with the velocity of sound in the crystal, namely about $2\times10^5$ cm./sec. This is sufficiently slower than the horizontal scan to make it suitable for the vertical scan. The mechanism of coupling between domains in the CdS and the X raster is the same as described for the Y raster. Naturally care must be taken when choosing the polarities for the energising fields that the effects due to the potentials at a point resulting from the coincidence of the two domains is additive. The above arrangement described an all solid-state system which will produce a scan spot of light travelling rapidly from left to right and more slowly downwards. No attempt has been made to describe the mechanism of luminescence or modulation, but clearly the latter could be applied by an electrode covering the whole screen and biased in such a way that its effect is added to the sum of the potentials on the X and Y electrodes.

The device shown in the drawing according to FIGS. 5*a* and *b* uses a raster of electrodes but the principle of the system could be applied without such a raster.

FIGS. 6*a* and *b* illustrate an alternative form for the solid-state scanning system detailed above and comprises a slab of semiconductive material 21, for example of gallium arsenide, having two ohmic contact areas 22 secured as previously described, at the left and right extremities such that a domain occupying the full width of the sample travels from left to right. A thin layer 25 of insulating material such as silica is formed on one face of the plate 21. A similar slab of semiconductive material 23, for example of CdS, having electrodes 24 secured as previously described at the top and bottom and an insulating layer 26 placed above the plate 21. A luminescent panel 27 is sandwiched between the plates 21 and 24.

In this system, the localized field appears at the point where the two domains, that is the domain 28 in the CdS and the domain 29 in the gallium arsenide, cross and the area of activity in the plates would be confined either by breaking this up into an isolated mosaic pattern or by relying on the spreading resistance in the luminescent plate 27. Again, the plate between the two crystals would have an overall sensing or modulating electrode whose effect was added to the field due to the coincidence of the two domains.

The resolution of the complete domain appears to be typically $\frac{1}{1000}$ inch, but since the fields in the domain are a function of distance throughout the domain, higher resolutions are possible if bias between threshold limits is used. The basic principle need not be limited to the use of the two types of domain phenomena illustrated. For example, it has been shown that due to field dependent mobilities associated with trapping effects, very slow moving domains can be obtained in germanium under suitable conditions thereby extending the possible range of scanning speeds which might be obtained.

It is to be understood that the foregoing description of specific examples of this invention is made by way of example only and is not to be considered as a limitation on its scope.

What I claim is:

1. A solid-state scanning system comprising two semiconductive circuit arrangements, each one of which includes a body of semiconductive material having two spaced contact areas and exhibiting high field instability effects upon application of a potential exceeding a predetermined threshold across said contact areas, means applying a potential difference between said areas of both bodies below said threshold producing therein an electric field, means applying an input pulse signal to one of said contact areas of each said body to raise the potential above said threshold for a period less than the instability transit time between said areas to cause corresponding pulses to propagate along each said body, means for extracting output signal pulses from said bodies, and a planar scanning element, said bodies being arranged on said planar element in transverse directions to form superimposed co-ordinate axes thereon whereby said pulses in each body provide a co-ordinate scanning action.

2. A solid-state scanning system as claimed in claim 1 wherein said means for extracting output signal pulses includes a thin layer of insulating material along each said body between said contact areas, and a plurality of electrodes along said layer for extracting a plurality of said output pulses.

3. A solid-state scanning system as claimed in claim 2 wherein said scanning element includes a first and second raster of thin metal electrodes and a layer of electroluminescent material therebetween, said first and second rasters being arranged transversely in a two dimensional co-ordinate array, wherein one of said bodies is positioned across one end of said first raster and the other of said bodies is positioned across one end of said second raster, said plurality of electrodes along each said insulating layer including respective said rasters, said insulating layers capacitively coupling said pulses to successive electrodes of said first and second rasters along said bodies, and wherein said pulses occurring between any two electrodes of respective said first and second rasters cause a spot of light to appear at the point of intersection.

4. A solid-state scanning system as claimed in claim 3 wherein a transparent layer of insulating material is positioned on each side of said scanning element over said first and second rasters.

5. A solid-state scanning system as claimed in claim 4 wherein said transparent layer of insulating material is of glass.

6. A solid-state scanning system as claimed in claim 5 wherein one of said first and second rasters of thin metal electrodes is transparent to the luminescent radiation.

7. A solid-state scanning system as claimed in claim 1 wherein said bodies are superimposed one above the other and a layer of electroluminescent material is interposed therebetween, and a layer of insulating material is interposed between each of said bodies and said electroluminescent layer, wherein said pulses occurring along each body and intersecting across said layer of electroluminescent material cause a spot of light to appear.

8. A solid-state scanning system as claimed in claim 1 wherein said two semiconductive bodies are of materials having different pulse transit time characteristics.

9. A solid-state scanning system as claimed in claim 8 wherein one of said bodies of semiconductive material is of gallium arsenide.

10. A solid-state scanning system as claimed in claim 9 wherein the other of said bodies of semiconductive material is of cadmium sulphide.

References Cited

UNITED STATES PATENTS

| | | | |
|---|---|---|---|
| 2,818,531 | 12/1957 | Peek | 315—169 |
| 3,015,747 | 1/1962 | Rosenberg | 315—169 |
| 3,035,200 | 5/1962 | Yando | 315—55 |
| 3,325,748 | 6/1967 | Crabbe | 317—234 |
| 3,365,583 | 1/1968 | Gunn | 317—234 |

JOHN W. HUCKERT, *Primary Examiner.*

JERRY D. CRAIG, *Assistant Examiner.*

U.S. Cl. X.R.

317—234; 331—107